(12) United States Patent
Lin et al.

(10) Patent No.: US 12,538,843 B2
(45) Date of Patent: Jan. 27, 2026

(54) PIXEL UNIT AND MANUFACTURING METHOD THEREOF

(71) Applicant: Lextar Electronics Corporation, Hsinchu (TW)

(72) Inventors: Chih-Hao Lin, Hsinchu (TW); Hsin-Lun Su, Hsinchu (TW); Min-Che Tsai, Hsinchu (TW); Jo-Hsiang Chen, Hsinchu (TW)

(73) Assignee: Lextar Electronics Corporation, Hsinchu (TW)

( * ) Notice: Subject to any disclaimer, the term of this patent is extended or adjusted under 35 U.S.C. 154(b) by 653 days.

(21) Appl. No.: 17/929,714

(22) Filed: Sep. 5, 2022

(65) Prior Publication Data

US 2023/0074731 A1 Mar. 9, 2023

(30) Foreign Application Priority Data

Sep. 8, 2021 (TW) ................................ 110133433

(51) Int. Cl.
| | |
|---|---|
| *H01L 25/075* | (2006.01) |
| *H10H 20/01* | (2025.01) |
| *H10H 20/852* | (2025.01) |
| *H10H 20/857* | (2025.01) |

(52) U.S. Cl.
CPC ........ *H01L 25/0753* (2013.01); *H10H 20/852* (2025.01); *H10H 20/857* (2025.01); *H10H 20/0362* (2025.01); *H10H 20/0364* (2025.01)

(58) Field of Classification Search
CPC . H01L 25/0753; H10H 20/857; H10H 20/852
See application file for complete search history.

(56) References Cited

U.S. PATENT DOCUMENTS

| | | | | |
|---|---|---|---|---|
| 9,595,638 | B2* | 3/2017 | Ahn | ........................ H10H 20/83 |
| 2017/0358724 | A1* | 12/2017 | Shichijo | .............. H01L 25/0753 |
| 2021/0225817 | A1* | 7/2021 | Liao | ...................... H10H 20/857 |

FOREIGN PATENT DOCUMENTS

| | | | | |
|---|---|---|---|---|
| KR | 20200021858 A | * | 3/2020 | ............. H01L 33/36 |
| TW | 201611346 A | | 3/2016 | |
| TW | 202032817 A | | 9/2020 | |

* cited by examiner

*Primary Examiner* — Monica D Harrison
*Assistant Examiner* — Jacob T Nelson
(74) *Attorney, Agent, or Firm* — CKC & Partners Co., LLC

(57) ABSTRACT

A pixel unit includes a substrate, a wiring layer and three light-emitting elements. The wiring layer includes first electrode wires and second electrode wires. The first electrode wires and the second electrode wires are arranged side by side and separated from each other by a spacing. A first blocking wall structure is at a first end portion of each of the first electrode wires, the first end portion is near the corresponding second electrode wires, and a second blocking wall structure is at a second end portion of each of the second electrode wires, the second end portion is near the corresponding first electrode wires. Three light-emitting elements emit red light, green light and blue light respectively. The light-emitting elements are in a flip chip configuration and are connected to one of the first electrode wires and one of the second electrode wires adjacent to each other respectively.

17 Claims, 14 Drawing Sheets

PIXEL UNIT AND MANUFACTURING METHOD THEREOF

CROSS-REFERENCE TO RELATED APPLICATION

This application claims priority to Taiwan Application Serial Number 110133433, filed Sep. 8, 2021, which is herein incorporated by reference in its entirety.

BACKGROUND

Field of Invention

The present disclosure relates to a pixel unit and a manufacturing method thereof.

Description of Related Art

LED displays are mainly composed of light-emitting diode units arranged in an array. The light-emitting diode units may be, for example, a package including at least three light-emitting diode chips, and the light-emitting diode chip provides three colors: red, green and blue. To enhance the resolution of LED displays, the LED displays are developed to have small pitches. For example, as the number of the light-emitting diode units used in the display increases, the sizes of the packages for the light-emitting diode units must be reduced.

To reduce the sizes of the LED packages, the sizes of the LED chips are also reduced. For example, the LED chips may be micro LED chips or mini LED chips. However, the spacing between wirings in the recent LED packages is not narrow enough to meet the requirements of micro LED chips or mini LED chips. FIGS. 9A-9G disclose a process of manufacturing a wiring 908 on a substrate 902 by etching. A conductive layer 904 and an ink layer 906 are formed on the substrate (FIGS. 9A and 9B). A light source LS is used to expose the ink layer 906 (FIG. 9C). The ink layer 906 is developed (FIG. 9D). The developed ink layer 906 is used as a mask to form the wiring 908 (FIG. 9E), and the ink layer 906 is removed (FIG. 9F). However, the spacing between the wirings formed by the method above is still not narrow enough. Also, as shown in FIG. 9G, the wiring 908 formed by etching tends to have an uneven shape, and the position of the light-emitting diode chip 910 may be shifted when the light-emitting diode chip 910 is attached to the wiring 908 by the solder paste 912 (FIGS. 9H and 9I).

SUMMARY

Some embodiments of the present disclosure provide a pixel unit including a substrate, a wiring layer and three light-emitting elements. The wiring layer includes a plurality of first electrode wires and a plurality of second electrode wires arranged on the substrate. The first electrode wires and the second electrode wires are arranged side by side and separated from each other by a spacing. A first blocking wall structure is at a first end portion of each of the first electrode wires, and the first end portion is near to the second electrode wires corresponding to the first electrode wires. A second blocking wall structure is at a second end portion of each of the second electrode wires, and the second end portion is near to the first electrode wires corresponding to the second electrode wires. Three light-emitting elements emit red light, green light and blue light respectively. The light-emitting elements are in a flip chip configuration and are connected to one of the first electrode wires and one of the second electrode wires adjacent to each other respectively.

In some embodiments, the first blocking wall structure protrudes from an upper surface of one of the first electrode wire in a direction far away from the substrate, and the second blocking wall structure protrudes from an upper surface of one of the second electrode wires in the direction far away from the substrate.

In some embodiments, the first blocking wall structure and one of the first electrode wires are a single piece of continuous material, and the second blocking wall structure and one of the second electrode wires are a single piece of continuous material.

In some embodiments, the first end portion of each of the first electrode wires has a linear sidewall, and the second end portion of each of the second electrode wires has another linear sidewall.

In some embodiments, each of the first electrode wires further has two first sidewalls opposite to each other, and the two first sidewalls are connected to two sides of the first blocking wall structure respectively, each of the second electrode wires further has two second sidewalls opposite to each other, and the two second sidewalls are connected to two sides of the second blocking wall structure respectively.

In some embodiments, each of the light-emitting elements includes a first electrode and a second electrode, and the first electrode and the second electrode are connected to one of the first electrode wires and one of the second electrode wires arranged side by side respectively.

In some embodiments, an upper surface of the first blocking wall structure is higher than a bottom surface of the first electrode of each of the light-emitting elements, and an upper surface of the second blocking wall structure is higher than a bottom surface of the second electrode of each of the light-emitting elements.

In some embodiments, the first blocking wall structure and the second blocking wall structure are between the first electrode and the second electrode of each of the light-emitting elements.

In some embodiments, the pixel unit further includes a plurality of first solder pads and second solder pads, and each of the light-emitting elements is electrically connected to one of the first electrode wires by one of the first solder pads and is electrically connected to one of the second electrode wires by one of the second solder pads, said one of the first solder pads and said one of the second solder pads are restricted by the first blocking wall structure and the second blocking wall structure respectively.

In some embodiments, three light-emitting elements are a first light-emitting element, a second light-emitting element and a third light-emitting element respectively, and the first light-emitting element is a red light-emitting diode chip, the second light-emitting element is a green light-emitting diode chip, and the third light-emitting element is a blue light-emitting diode chip.

In some embodiments, three light-emitting elements are a first blue light-emitting diode chip, a second blue light-emitting diode chip and a third blue light-emitting diode chip respectively, a red light wavelength conversion layer is disposed on an upper surface of the first blue light-emitting diode chip, and a green light wavelength conversion layer is disposed on an upper surface of the second blue light-emitting diode chip.

In some embodiments, a blue light wavelength conversion layer is disposed on an upper surface of the third blue light-emitting diode chip.

In some embodiments, the light-emitting elements are micro light-emitting diode chips or mini light-emitting diode chips, and the spacing between the first electrode wires and the second electrode wires is in a range from 3 microns to 20 microns.

In some embodiments, the pixel unit further includes a sealing member covering the substrate, the wiring layer and the light-emitting elements.

In some embodiments, the pixel unit further includes a common electrode, wherein the first electrode wires are connected to the common electrode.

Some embodiments of the present disclosure provide a method of forming a pixel unit including forming a wiring layer on a substrate. The wiring layer is cut by using a laser to form a plurality of first electrode wires and a plurality of second electrode wires in the wiring layer, and the first electrode wires and the second electrode wires are arranged side by side and are separated from each other by a spacing. During cutting the wiring layer by using the laser, a first blocking wall structure is formed at a first end portion of each of the first electrode wires, and a second blocking wall structure is formed at a second end portion of each of the second electrode wires. Three light-emitting elements are disposed on the wiring layer, and three light-emitting elements emit red light, green light and blue light respectively, and the light-emitting elements are in a flip chip configuration and are connected to one of the first electrode wires and one of the second electrode wires adjacent to each other respectively.

In some embodiments, the light-emitting elements are micro light-emitting diode chips or mini light-emitting diode chips, the spacing between the first electrode wires and the second electrode wires is in a range from 3 microns to 20 microns.

In some embodiments, the method further includes coating a sealing member, such that the sealing member covers the substrate, the wiring layer and the light-emitting elements.

In some embodiments, the method further includes coating a solder paste at inner sides of the first blocking wall structure and the second blocking wall structure before disposing the light-emitting elements on the wiring layer.

In some embodiments, the method further includes forming solder pads at the first end portion and the second end portion after disposing the light-emitting elements on the wiring layer.

In the present disclosure, using laser cutting to manufacture pixel units may shorten the line spacings and reduce the cost at the same time. Moreover, the blocking wall structures formed due to the laser cutting may restrict the positions of the light-emitting elements to ensure that the light-emitting elements are in contact with the electrode wires, thereby increasing the yield of the pixel unit.

It is to be understood that both the foregoing general description and the following detailed description are by examples, and are intended to provide further explanation of the disclosure as claimed.

BRIEF DESCRIPTION OF THE DRAWINGS

The disclosure can be more fully understood by reading the following detailed description of the embodiment, with reference made to the accompanying drawings as follows.

DETAILED DESCRIPTION

Figure 1A:
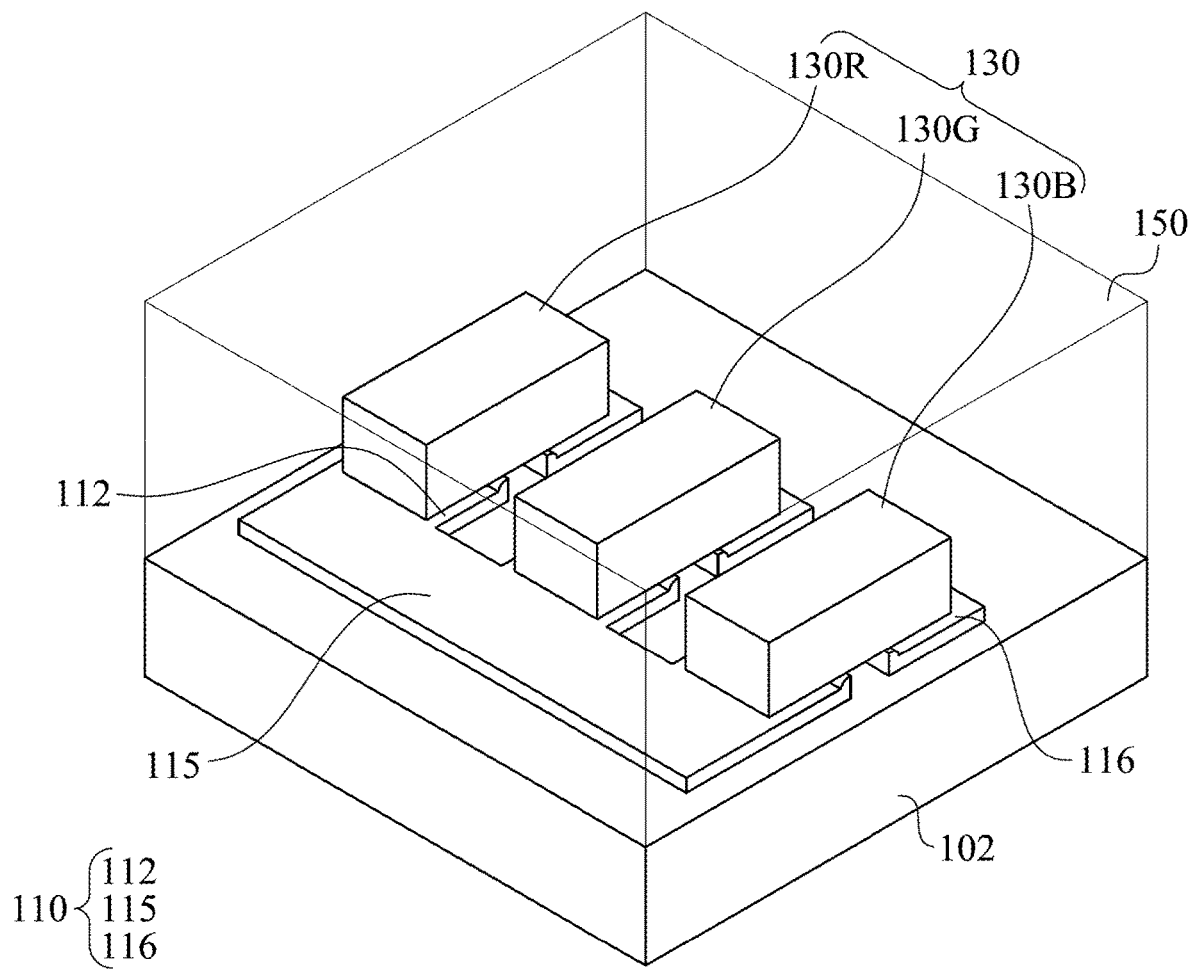
FIG. 1A illustrates a perspective view of a pixel unit in some embodiments of the present disclosure.

Reference will now be made in detail to the present embodiments of the disclosure, examples of which are illustrated in the accompanying drawings. Wherever possible, the same reference numbers are used in the drawings and the description to refer to the same or like parts.

In various embodiments, description is made with reference to figures. However, certain embodiments may be practiced without one or more of these specific details, or in combination with other known methods and configurations. In the following description, numerous specific details are set forth, such as specific configurations, dimensions and processes, etc., in order to provide a thorough understanding of the present disclosure. In other instances, well-known semiconductor processes and manufacturing techniques have not been described in particular detail in order to not unnecessarily obscure the present disclosure. Reference throughout this specification to "one embodiment," "an embodiment", "some embodiments" or the like means that a particular feature, structure, configuration, or characteristic described in connection with the embodiment is included in at least one embodiment of the disclosure. Thus, the appearances of the phrase "in one embodiment," "in an embodiment", "in some embodiments" or the like in various places throughout this specification are not necessarily referring to the same embodiment of the disclosure. Furthermore, the particular features, structures, configurations, or characteristics may be combined in any suitable manner in one or more embodiments.

The terms "over," "to," "between" and "on" as used herein may refer to a relative position of one layer with respect to other layers. One layer "over" or "on" another layer or bonded "to" another layer may be directly in contact with the other layer or may have one or more intervening layers. One layer "between" layers may be directly in contact with the layers or may have one or more intervening layers.

In some embodiments of the present disclosure, pixel units with narrower and finer line spacings are achieved. Specifically, a wiring layer is cut by using laser in the present disclosure, such that the spacings between the electrode wires are narrower. The method can reduce the line spacings in the pixel unit easily, thereby lowering the cost of the process. Moreover, the electrode wires cut by using a laser have several advantages to increase the yield of the pixel unit.

Figure 1B:
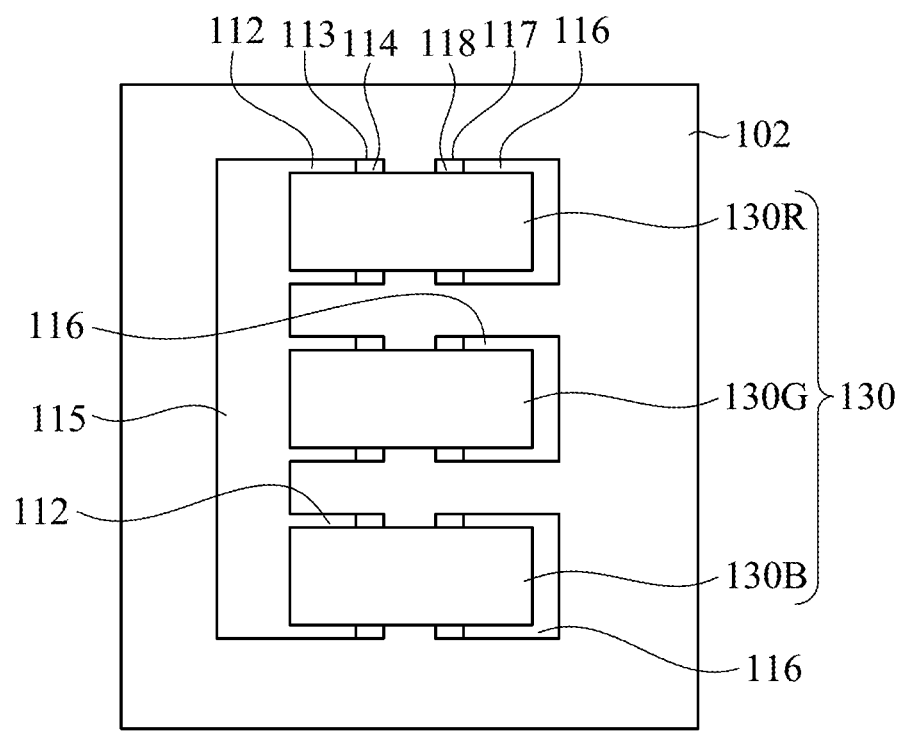
FIG. 1B is a top view of the pixel unit in FIG. 1A.

FIG. 1A illustrates a perspective view of pixel unit 100 in some embodiments of the present disclosure, and FIG. 1B is a top view of the pixel unit 100 in FIG. 1A. The pixel unit 100 includes a substrate 102, a wiring layer 110 and three light-emitting elements 130. The wiring layer 110 is on the substrate 102, and the wiring layer 110 includes a plurality of first electrode wires 112 and a plurality of second electrode wires 116 arranged on the substrate 102. The light-emitting elements 130 are in a flip chip configuration and are connected to the first electrode wire 112 and second electrode wire 116 arranged side by side and adjacent to each other. The pixel unit 100 may further include a sealing member 150. The sealing member 150 is on the substrate 102 and covers the substrate 102, the wiring layer 110 and the light-emitting elements 130.

Figure 2A:
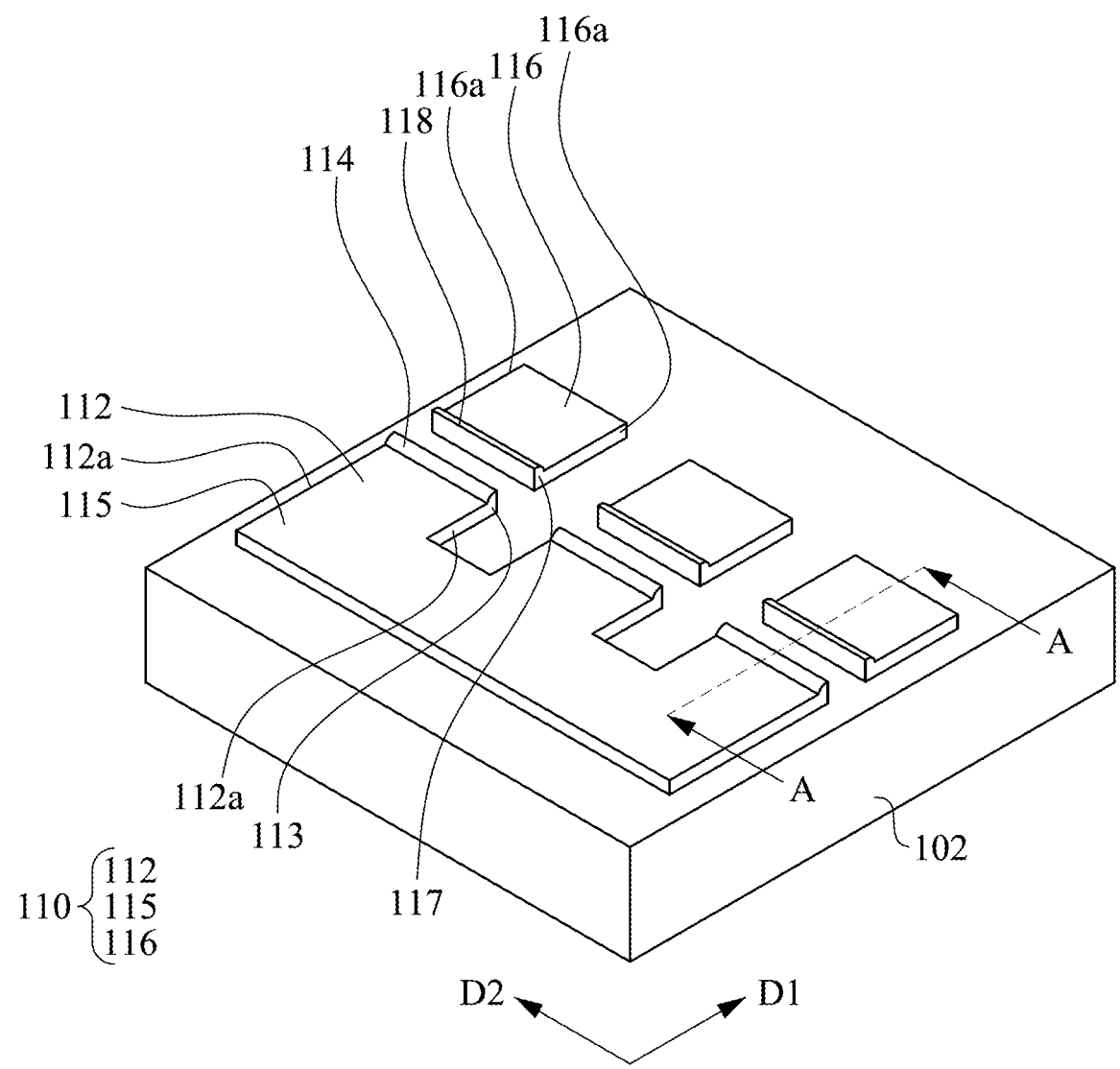
FIG. 2A is a perspective view of the substrate and the wiring layer.
Figure 2B:
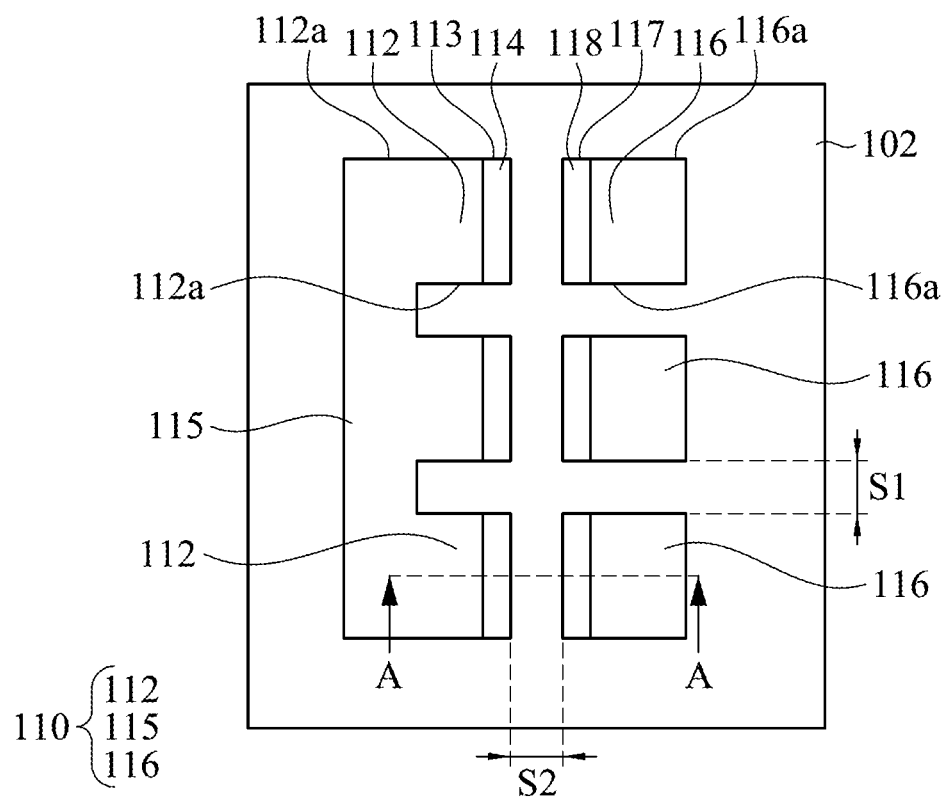
FIG. 2B is a top view of FIG. 2A.
Figure 2C:
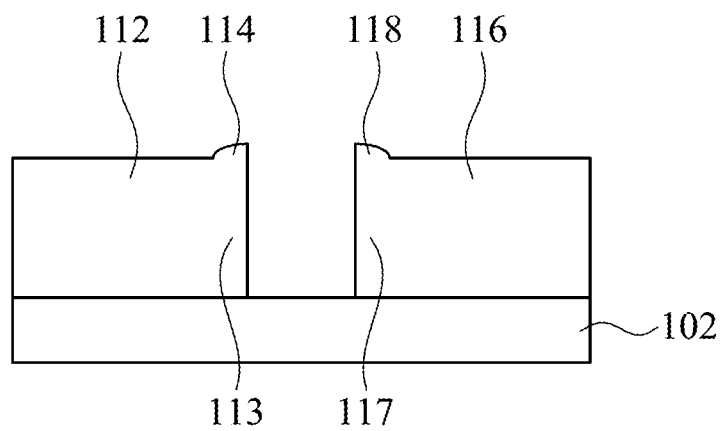
FIG. 2C is a cross-section view taken along line A-A in FIG. 2A.

FIG. 2A is a perspective view of the substrate 102 and the wiring layer 110. FIG. 2B is a top view of FIG. 2B, and FIG. 2C is a cross-section view taken along line A-A in FIG. 2A. To clearly illustrate the structure of the wiring layer 110, FIGS. 2A-2C only illustrate the substrate 102 and the wiring layer 110 of the pixel unit 100. In some embodiments, as shown in FIG. 2A, in a direction D1, three first electrode wires 112 and three second electrode wires 116 are arranged side by side and aligned with each other respectively, and in another direction D2, three first electrode wires 112 are aligned with each other. As shown in FIG. 2B, the adjacent first electrode wires 112 are separated from each other by a first spacing S1, and the first electrode wire 112 and the corresponding second electrode wire 116 are separated from each other by a second spacing S2. The second spacing S2 is narrower than the first spacing S1. In some embodiments, the first spacing S1 is in a range from about 50 microns to about 125 microns, and the second spacing S2 is in a range from about 3 microns to about 20 microns. Moreover, different first electrode wires 112 may be connected to a common electrode 115. The first electrode wires 112 and the second electrode wires 116 are electrically opposite electrodes, and the common electrode 115 and the first electrode wire 112 are electrically common electrodes. For example, when the first electrode wires 112 and the common electrode 115 are positive electrode wires, the second electrode wires 116 are negative electrode wires, and vice versa. In some embodiments, the wiring layer 110 is made of metal, such as copper.

A first blocking wall structure 114 is at a first end portion 113 of each of the first electrode wires 112 wherein the first end portion 113 is near the corresponding second electrode wire 116. A second blocking wall structure 118 is at a second end portion 117 of each of the second electrode wires 116 wherein the second end portion 117 is near the corresponding first electrode wire 112. As shown in FIG. 2A or FIG. 2C, the first blocking wall structure 114 protrudes from an upper surface of the first electrode wire 112 in a direction far away from the substrate 102, and the second blocking wall structure 118 protrudes from an upper surface of the second electrode wire 116 in a direction far away from the substrate 102. As shown in FIG. 2B, the first electrode wire 112 further has two first sidewalls 112a in opposite to each other, and the two first sidewalls 112a are connected to two sides of the first blocking wall structure 114 respectively. The second electrode wire 116 further has two second sidewalls 116a in opposite to each other, and the two second sidewalls 116a are connected to two sides of the second blocking wall structure 118 respectively. The first blocking wall structure 114 and the second blocking wall structure 118 are formed by accumulation of debris generated during using a laser to cut the wiring layer 110. Therefore, the first blocking wall structure 114 and the second blocking wall structure 118 are made of the same material as the material of the first electrode wire 112 and the second electrode wire 116. Since the first blocking wall structure 114 and the second blocking wall structure 118 are formed by accumulation of debris, the upper surfaces of the first blocking wall structure 114 and the second blocking wall structure 118 may be rough.

Back to FIGS. 1A and 1B, the light-emitting elements 130 are micro light-emitting diode chips or mini light-emitting diode chips. In some embodiments, the light-emitting elements 130 may include a first light-emitting element 130R, a second light-emitting element 130G, and a third light-emitting element 130B, as shown in FIGS. 1A and 1B. The first light-emitting element 130R, the second light-emitting element 130G, and the third light-emitting element 130B emit red light, green light, and blue light respectively. Electrodes (such as the first electrode 132 and the second electrode 134 in FIG. 6B) of each of the light-emitting elements 130 are connected to one of the first electrode wires 112 and one of the second electrode wires 116 arranged side by side. It is noted that the number of the light-emitting elements 130, the first electrode wires 112 and the second electrode wires 116 illustrated in FIGS. 1A and 1B is not limited to three. For example, the number may be greater than three. However, the number of the light-emitting elements 130, the first electrode wires 112 and the second electrode wires 116 should be the same.

The substrate 102 may be a substrate having integrated circuit therein, and may be made of any suitable materials, such as BT resin, molded interconnect substrate (MIS), epoxy molding compound (EMC), sheet molding compound (SMC), FR-4, glass, polyimide, polysiloxane, or the like. In some embodiments, the thickness of the substrate 102 is in a range from about 5 microns to about 150 microns.

The sealing member 150 may be a transparent material. Moreover, black carbon powder may be added into the transparent material. The transparent material may be made of any suitable material, such as polysiloxane, epoxy, or the like. In some embodiments, the thickness of the sealing member 150 is in a range from about 100 microns to about 300 microns.

Figure 3A:
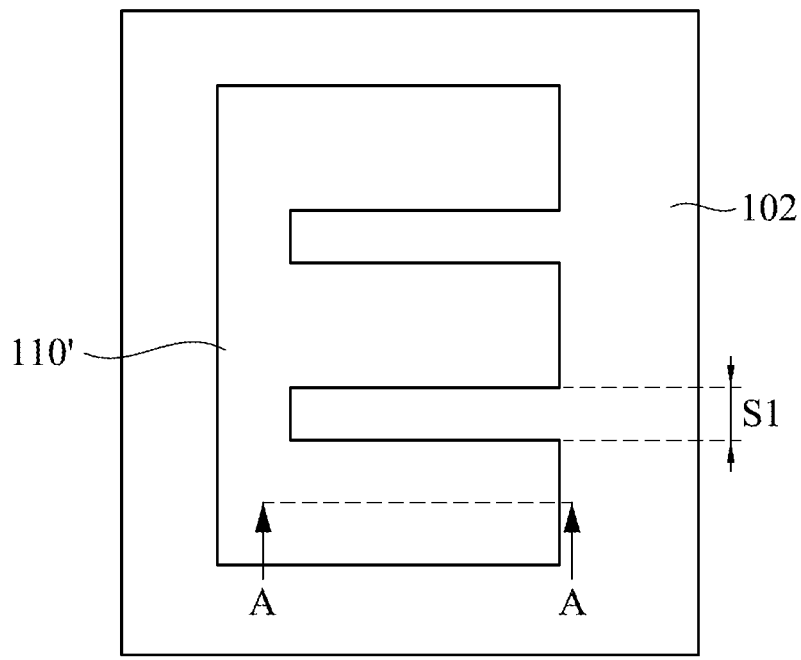
FIGS. 3A, 4A, 5A and 6A illustrate top views of the manufacturing process of the pixel unit in some embodiments of the present disclosure.
Figure 3B:
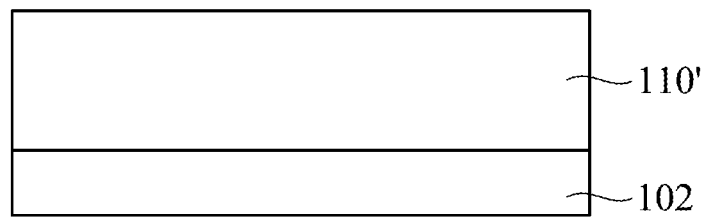
FIGS. 3B, 4B, 5B and 6B illustrate cross-section views of the manufacturing process of the pixel unit taken along line A-A in FIGS. 3A, 4A, 5A and 6A respectively in some embodiments of the present disclosure.

FIGS. 3A, 4A, 5A and 6A illustrate top views of the manufacturing process of the pixel unit 100 in some embodiments of the present disclosure. FIGS. 3B, 4B, 5B and 6B illustrate cross-section views of the manufacturing process of the pixel unit 100 taken along line A-A in FIGS. 3A, 4A, 5A and 6A respectively in some embodiments of the present disclosure. In FIGS. 3A and 3B, a wiring layer 110' is formed on the substrate 102. The wiring layer 110' includes a conductive metallic material, such as copper layer. The wiring layer 110' is a patterned wiring layer, and is formed as a wiring layer having three strip-shaped parts with one of the ends connected to each other (or finger-shaped wiring layer), as shown in FIG. 3A. Each strip-shaped part has a first spacing S1 therebetween. The patterned wiring layer 110' may be cut by, for example, an etching process. The sidewall (such as first sidewall 112a and second sidewall 116a in FIGS. 2A and 2B) and the upper surface of the patterned wiring layer 110 have a round corner (as shown in FIGS. 7A and 7B in later discussion) between them. In some embodiments, the first spacing S1 is in a range from about 50 microns to about 125 microns. It is noted that the pattern of the wiring layer 110' is not limited to the pattern shown in FIG. 3A, and may have any suitable pattern. For example, the wiring layer 110' may include three strip-shaped parts arranged side by side but not connected to each other.

Figure 4A:
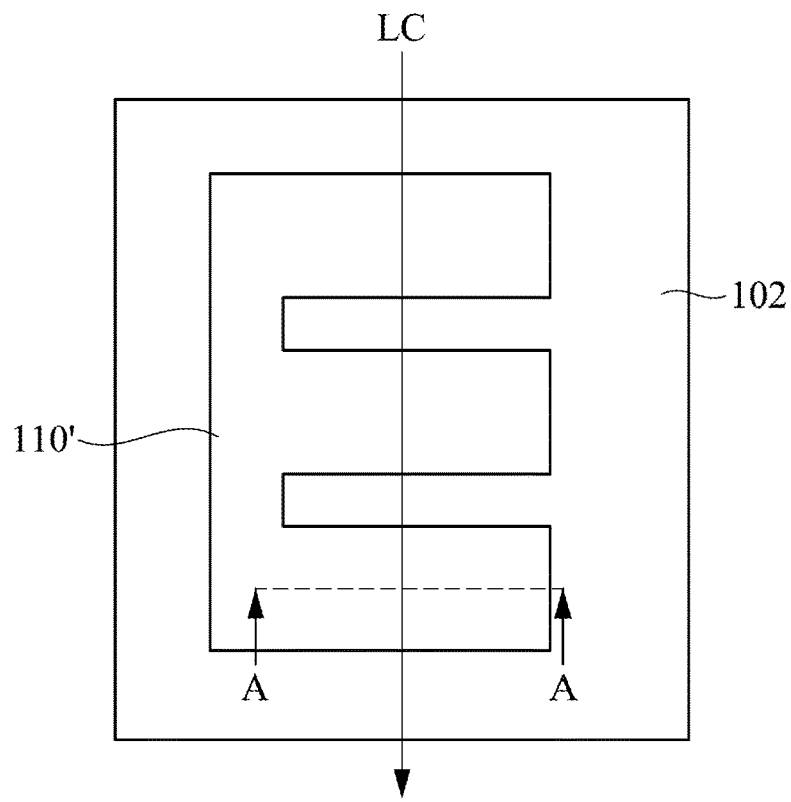
Figure 4B:
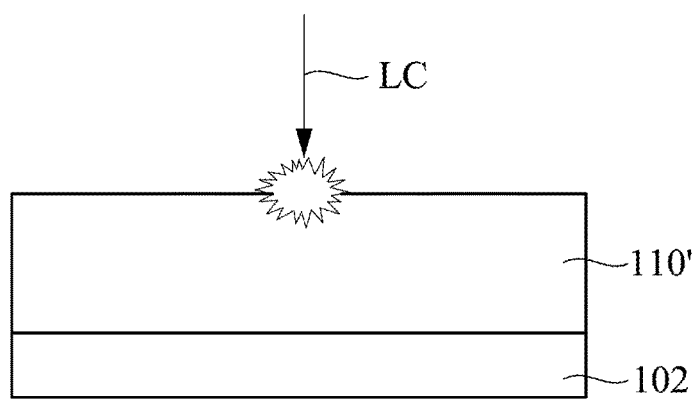
Figure 5A:
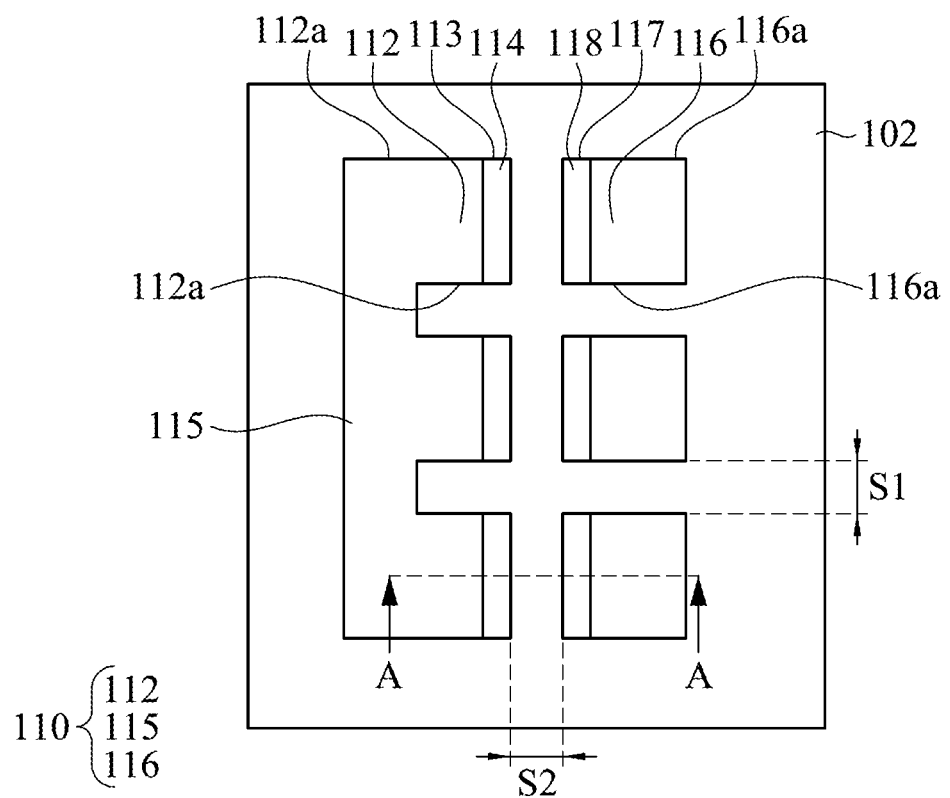
Figure 5B:
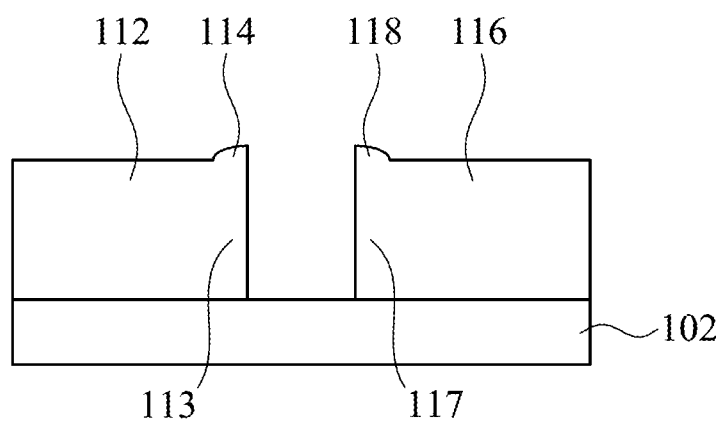

Subsequently, in FIGS. 4A and 4B, a laser LC is used to cut the wiring layer 110' to form a wiring layer 110 including a plurality of the first electrode wires 112 and a plurality of second electrode wires 116, as shown in FIGS. 5A and 5B. A plurality of the first electrode wires 112 and a plurality of the second electrode wires 116 are separated from each other by the second spacing S2. Since the laser LC may be used to form a finer spacing, the second spacing S2 is narrower than the first spacing S1. Using laser cutting described herein may make the second spacing S2 between the first electrode wires 112 and the second electrode wires 116 become narrower. For example, the second spacing S2 is in a range from about 3 microns to about 20 microns, and may be applied to micro light-emitting diode chips and mini light-emitting diode chips. Moreover, using the laser LC to cut the wiring layer 110' may also lower the cost and the complexity of the process of reducing the spacing.

During using the laser LC to cut the wiring layer 110', due to the characteristic of the laser cutting, the first end portion 113 and the second end portion 117 have a linear sidewall 113a and a linear sidewall 117a respectively (see FIG. 6A), such that the first electrode wire 112 and the second electrode wire 116 may be in contact with the light-emitting elements (such as the light-emitting elements 130 in FIG. 6A and the third light-emitting element 130B in FIG. 6B) better in the subsequent process. Debris generated from using laser LC to cut the wiring layer 110' are accumulated at two sides of the cut, and the first blocking wall structure 114 is formed at the first end portion 113 of each of the first electrode wires 112, the second blocking wall structure 118 is formed at the second end portion 117 of the second electrode wires 116. The first end portion 113 and the second end portion 117 are at two sides of the cut respectively. Materials of debris generated from using laser LC to cut the wiring layer 110' and materials of the first electrode wires 112 and the second electrode wires 116 are the same. Therefore, the first blocking wall structure 114 and the first electrode wire 112 are a single piece of continuous material, and the second blocking wall structure 118 and the second electrode wire 116 are a single piece of continuous material, as shown in FIGS. 5A and 5B.

Subsequently, in FIGS. 6A and 6B, the light-emitting elements 130 are disposed on the wiring layer 110, and the light-emitting elements 130 may include the first light-emitting element 130R, the second light-emitting element 130G and the third light-emitting element 130B. Each of the light-emitting elements 130 includes a first electrode 132 and a second electrode 134, and the first electrode 132 and the second electrode 134 are connected to one of the first electrode wires 112 and one of the second electrode wires 116 arranged side by side respectively. Specifically, before disposing the light-emitting elements 130, a moderate amount of soldering paste is coated on the inner sides of the first blocking wall structure 114 and the second blocking wall structure 118. Subsequently, the light-emitting elements 130 are disposed on the solder paste on the first electrode wire 112 and the second electrode wire 116, followed by soldering. After soldering, a plurality of first solder pads 142 and a plurality of second solder pads 144 are formed. Each of the light-emitting elements 130 is electrically connected to the first electrode wire 112 by one of the first solder pads 142 and is electrically connected to the second electrode wire 116 by one of the second solder pads 144. The first solder pad 142 and the second solder pad 144 are restricted by the first blocking wall structure 114 and the second blocking wall structure 118 respectively.

During soldering, due to fluidity of the solder paste, when the light-emitting elements 130 are disposed on the solder paste, the position of the light-emitting elements 130 may be shifted slightly. However, in FIG. 6B, the wiring layer 110 includes the first blocking wall structure 114 and the second blocking wall structure 118. The first blocking wall structure 114 and the second blocking wall structure 118 may press against the first electrode 132 and the second electrode 134 to restrict the position of the light-emitting elements 130. Specifically, the upper surface 114a of the first blocking wall structure 114 and the upper surface 118a of the second blocking wall structure 118 are higher than the bottom surface 132a of the first electrode 132 of the light-emitting element 130, and the first blocking wall structure 114 and the second blocking wall structure 118 are between the first electrode 132 and the second electrode 134 of the light-emitting element 130. Even though the amount of the solder paste is not distributed evenly, the first blocking wall structure 114 and the second blocking wall structure 118 may also restrict the position of the light-emitting elements 130 to ensure that the light-emitting elements 130 will not move. Therefore, after soldering, the first electrode 132 and the second electrode 134 of the light-emitting element 130 are still in contact with the first electrode wire 112 and the second electrode wire 116 respectively. As such, the first blocking wall structure 114 and the second blocking wall structure 118 of the pixel unit 100 reduce the risk of loose contact between the light-emitting elements 130, first electrode wire 112, and the second electrode wire 116, thereby increasing the yield of the pixel unit 100. After soldering, sealing member 150 (see FIG. 2A) is coated subsequently. The details of the sealing member are similar to or same as the sealing member 150 in FIG. 2A, so the details are not described herein repeatedly.

Figure 6A:
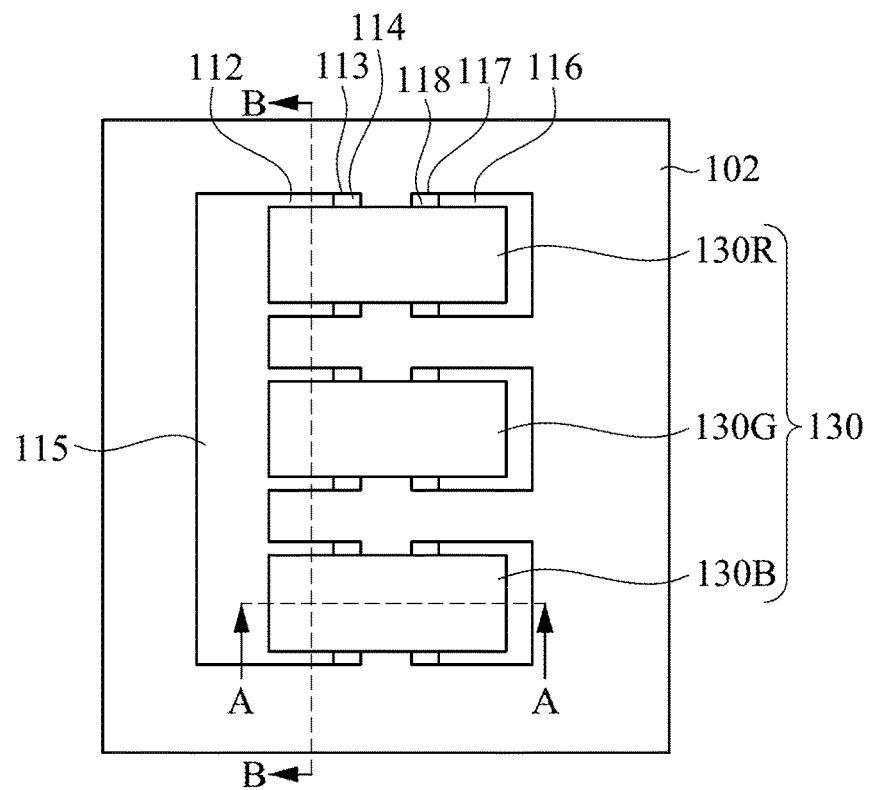
Figure 6B:
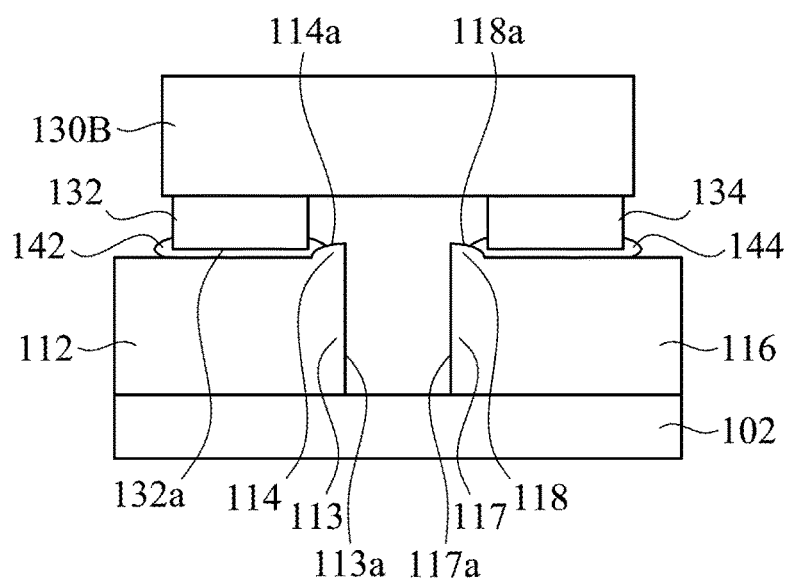
Figure 7A:
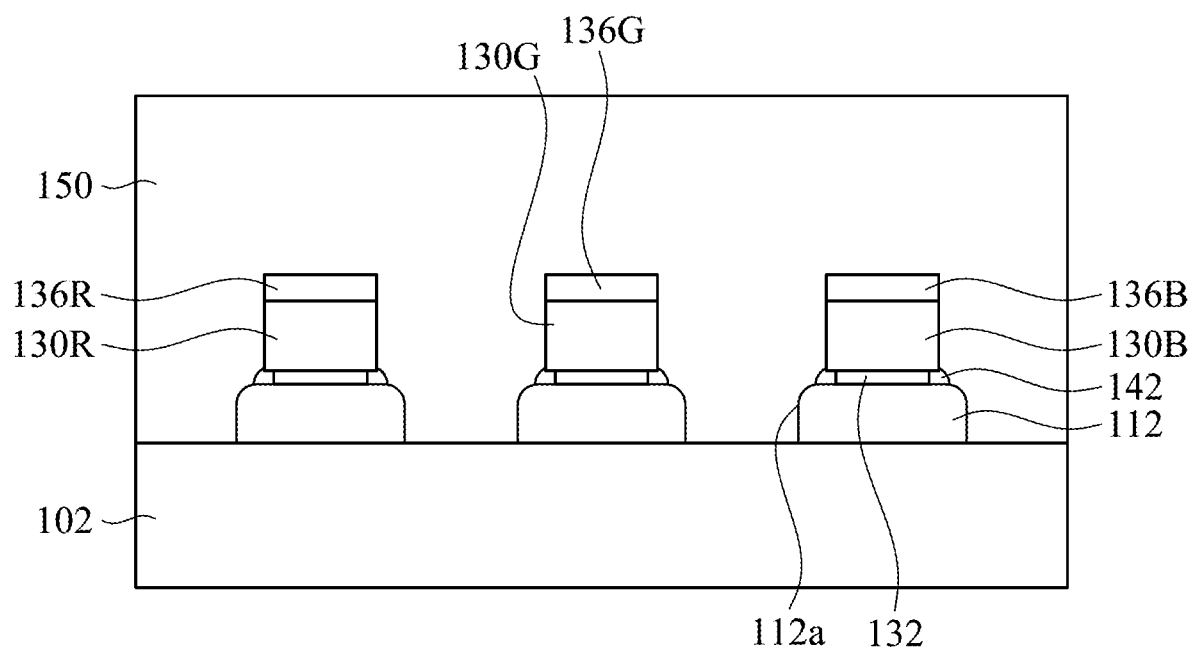
FIG. 7A illustrates a cross-section view taken along line B-B in FIG. 6A in some embodiments of the present disclosure.
Figure 7B:
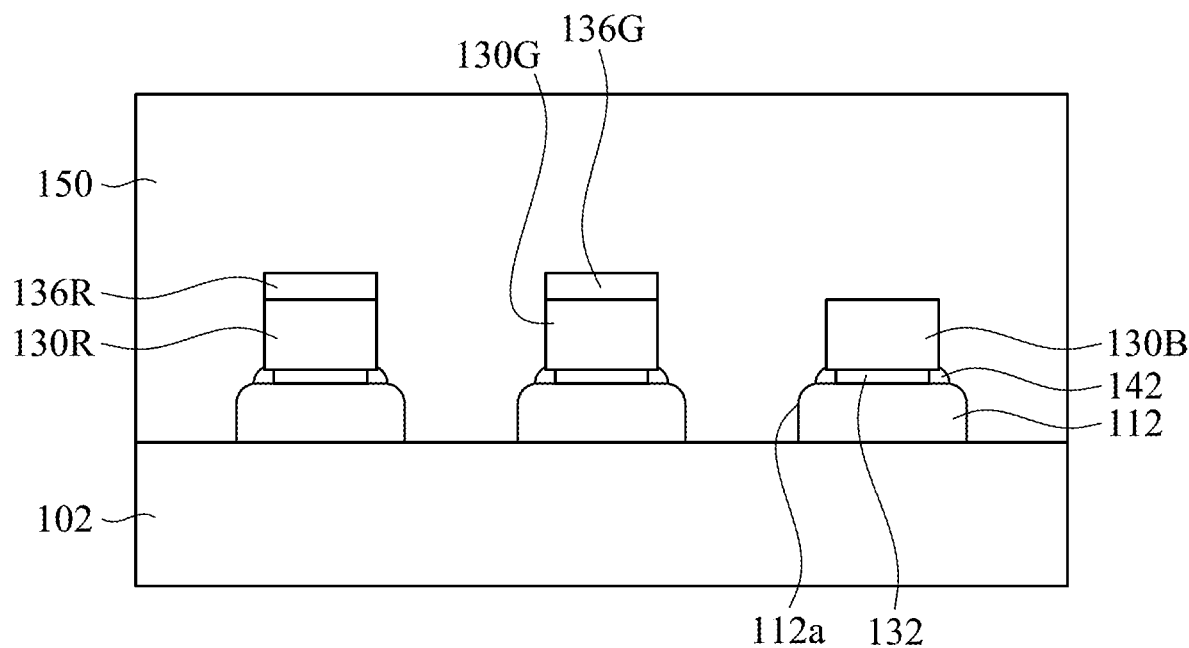
FIG. 7B illustrates a cross-section view taken along line B-B in FIG. 6A in some other embodiments of the present disclosure.

FIG. 7A illustrates a cross-section view taken along line B-B in FIG. 6A in some embodiments of the present disclosure. In FIG. 7A, the first electrodes 132 of the first light-emitting element 130R, the second light-emitting element 130 and the third light-emitting element 130B are in contact with the first electrode wires 112 by the first solder pads 142. Since the first electrode wires 112 are formed by using a general etching process, the first sidewall 112a and the upper surface of the first electrode wire 112 have a round corner between them, and the radian of the first sidewall 112a of the first electrode wire 112 is greater than the radian of the sidewall 113a (see FIG. 6B) of the first end portion 113. Although not shown in FIG. 7A, the second sidewall 116a and the upper surface of the second electrode wire 116 have also a round corner between them, and the radian of the second sidewall 116a of the first electrode wire 112 is greater than the radian of the sidewall 117a (see FIG. 6B) of the second end portion 117.

In some embodiments, the first light-emitting element 130R is a red light-emitting diode chip, the second light-emitting element 130G is a green light-emitting diode chip, and the third light-emitting element 130B is a blue light-emitting diode chip. In some other embodiments, the first light-emitting element 130R is a first blue light-emitting diode chip, the second light-emitting element 130G is a second blue light-emitting diode chip, and the third light-emitting element 130B is a third blue light-emitting diode chip. When the first light-emitting element 130R is a first blue light-emitting diode chip, a red light wavelength conversion layer 136R is disposed on the upper surface of the first light-emitting element 130R to convert blue light emitted from the first blue light-emitting diode chip into red light. When the second light-emitting element 130G is a second blue light-emitting diode chip, a green light wavelength conversion layer 136G is disposed on the upper surface of the second light-emitting element 130G to convert blue light emitted from the second blue light-emitting diode chip into green light. When the third light-emitting element 130G is a third blue light-emitting diode chip, a blue light wavelength conversion layer 136B is disposed on the upper surface of the third light-emitting element 130B, or the blue light wavelength conversion layer 136B is not disposed on the upper surface of the third light-emitting element 130B. In some embodiments, the blue light wavelength conversion layer 136B may be omitted, as shown in FIG. 7B. In some embodiments, the red light wavelength conversion layer 136R, the green light wavelength conversion layer 136G, and the blue light wavelength conversion layer 136B may include quantum dot material or phosphor material.

Figure 8A:
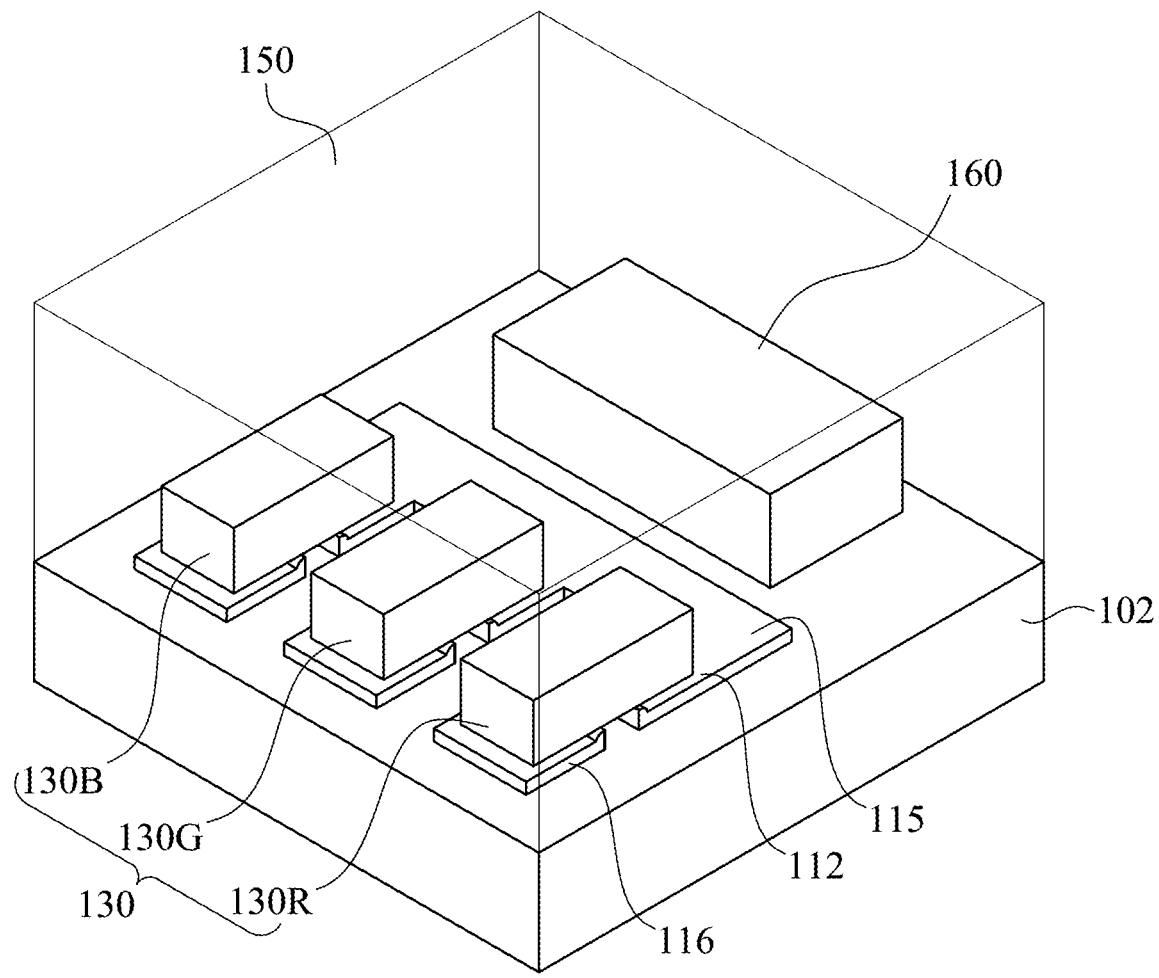
FIGS. 8A-8B illustrate pixel units in some other embodiments in the present disclosure.
Figure 8B:
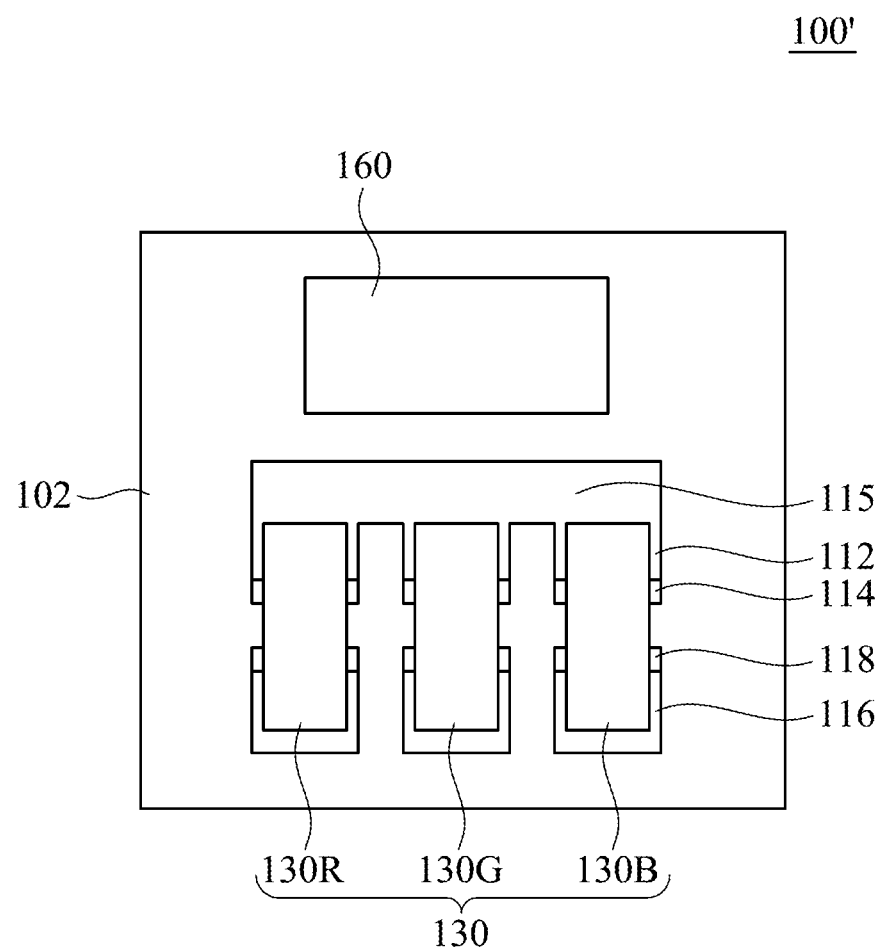
Figure 9A:
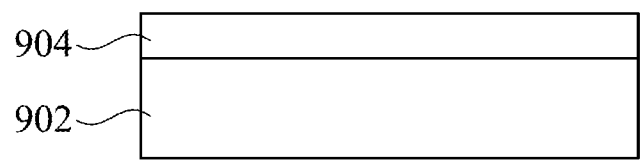
FIGS. 9A-9I illustrate cross-section views of the manufacturing process of the wiring in different stages.
Figure 9B:
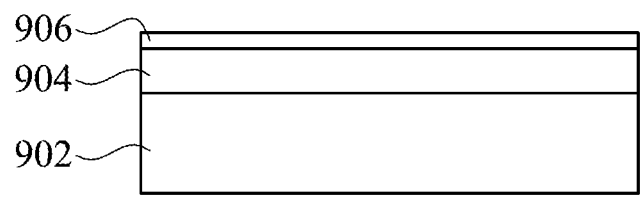
Figure 9C:
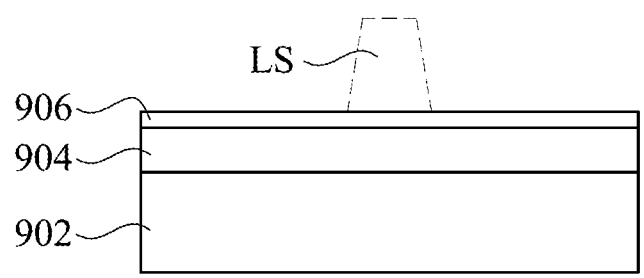
Figure 9D:
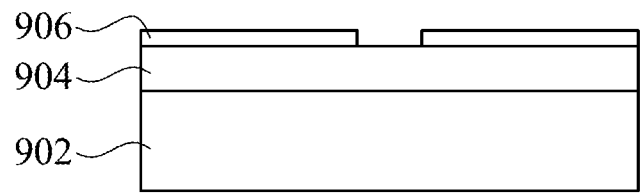
Figure 9E:
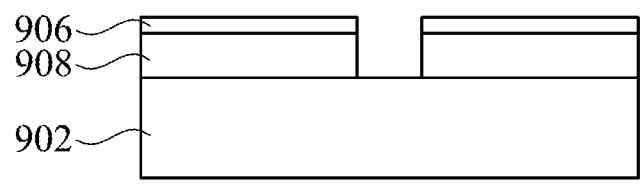
Figure 9F:
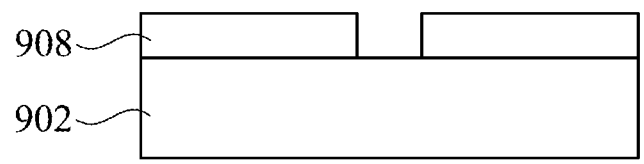
Figure 9G:
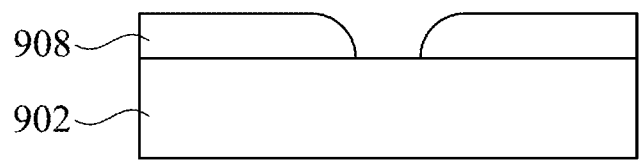
Figure 9H:
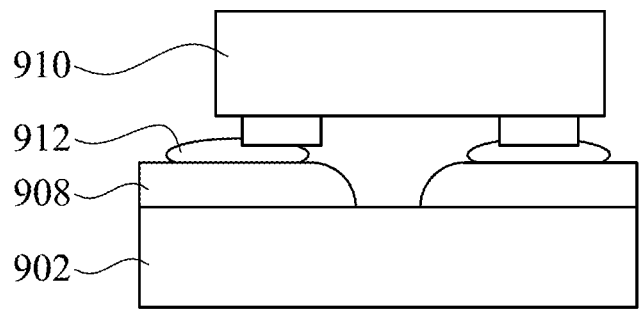
Figure 9I:
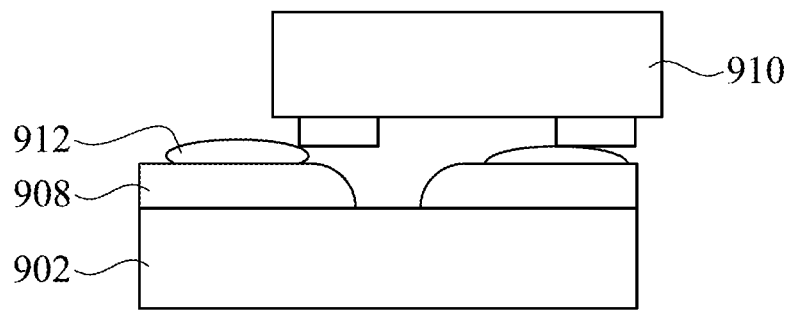

FIGS. 8A-8B illustrate a pixel unit 100' in some other embodiments in the present disclosure. The pixel unit 100' is similar to the pixel unit 100 described before. The difference between them is that the integrated circuit of the pixel unit 100 is embedded in the substrate 102, and the integrated circuit of the pixel unit 100' is disposed in an integrated circuit structure 160. In some embodiments, the integrated circuit structure 160 may be adjacent to the light-emitting element 130R, the light-emitting element 130G and the light-emitting element 130B, as shown in FIGS. 8A and 8B.

In the present disclosure, using laser cutting to manufacture pixel units may shorten the line spacings and reduce the cost at the same time. Moreover, the blocking wall structures formed due to the laser cutting may restrict the positions of the light-emitting elements to ensure that the light-emitting elements are in contact with the electrode wires, thereby increasing the yield of the pixel unit.

Although the present disclosure has been described in considerable detail with reference to certain embodiments thereof, other embodiments are possible. Therefore, the spirit and scope of the appended claims should not be limited to the description of the embodiments contained herein.

It will be apparent to those skilled in the art that various modifications and variations can be made to the structure of the present disclosure without departing from the scope or spirit of the disclosure. In view of the foregoing, it is intended that the present disclosure covers modifications and variations of this disclosure provided they fall within the scope of the following claims.

What is claimed is:

1. A pixel unit, comprising:
   a substrate;
   a first electrode wire and a second electrode wire arranged on the substrate, wherein the first electrode wire and the second electrode wire are separated from each other by a first spacing;
   a first blocking wall structure disposed at a first end portion of the first electrode wire wherein the first end portion is disposed near the second electrode wire;
   a second blocking wall structure disposed at a second end portion of the second electrode wire, wherein the second end portion is disposed near the first electrode wire; and
   a first light-emitting element connected to the first electrode wire and the second electrode wire in a flip chip configuration, wherein the first light-emitting element comprises a first electrode and a second electrode, and the first electrode and the second electrode are connected to the first electrode wire and the second electrode wires respectively, and an upper surface of the first blocking wall structure is higher than a bottom surface of the first electrode, and an upper surface of the second blocking wall structure is higher than a bottom surface of the second electrode.

2. The pixel unit of claim 1, wherein the first blocking wall structure protrudes from an upper surface of the first electrode wire in a direction away from the substrate, and the second blocking wall structure protrudes from an upper surface of the second electrode wire in the direction away from the substrate.

3. The pixel unit of claim 1, wherein the first blocking wall structure and the first electrode wire are a single piece of continuous material, and the second blocking wall structure and the second electrode wire are a single piece of continuous material.

4. The pixel unit of claim 1, wherein the first end portion of the first electrode wire has a linear sidewall, and the second end portion of the second electrode wire has another linear sidewall.

5. The pixel unit of claim 1, wherein:
   the first electrode wire further has two first sidewalls opposite to each other, and the two first sidewalls connect to two sides of the first blocking wall structure respectively; and
   the second electrode wire further has two second sidewalls opposite to each other, and the two second sidewalls connect to two sides of the second blocking wall structure respectively.

6. The pixel unit of claim 1, wherein the first blocking wall structure and the second blocking wall structure are between the first electrode and the second electrode of the first light-emitting element.

7. The pixel unit of claim 1, further comprising a first solder pad and a second solder pad, wherein the first light-emitting element is electrically connected to the first electrode wire by the first solder pad and is electrically connected to the second electrode wire by the second solder pad, and said first solder pad and said the second solder pad are restricted by the first blocking wall structure and the second blocking wall structure respectively.

8. The pixel unit of claim 1, further comprising a wavelength conversion layer disposed on an upper surface of the first light-emitting element.

9. The pixel unit of claim 1, wherein the first light-emitting element is a micro light-emitting diode chip or a mini light-emitting diode chip, and the first spacing is in a range from 3 microns to 20 microns.

10. The pixel unit of claim 1, further comprising a sealing member covering the substrate, the first electrode wire, the second electrode wire, and the first light-emitting element.

11. The pixel unit of claim 1, further comprising:
   a third electrode wire and a fourth electrode wire arranged on the substrate, wherein the third electrode wire and the fourth electrode wire are separated from each other by the first spacing;
   a third blocking wall structure disposed at a third end portion of the third electrode wire, wherein the third end portion is disposed near the fourth electrode wire;
   a fourth blocking wall structure disposed at a fourth end portion of the fourth electrode wire, wherein the fourth end portion is disposed near the third electrode wire; and
   a second light-emitting element connected to the third electrode wire and the fourth electrode wire in a flip chip configuration.

12. The pixel unit of claim 11, further comprising:
a fifth electrode wire and a sixth electrode wire arranged on the substrate, wherein the fifth electrode wire and the sixth electrode wire are separated from each other by the first spacing;
a fifth blocking wall structure disposed at a fifth end portion of the fifth electrode wire wherein the fifth end portion is disposed near the sixth electrode wire;
a sixth blocking wall structure disposed at a sixth end portion of the sixth electrode wire, wherein the sixth end portion is disposed near the fifth electrode wire; and
a third light-emitting element connected to the fifth electrode wire and the sixth electrode wire in a flip chip configuration.

13. The pixel unit of claim 12, further comprising a common electrode, wherein the first electrode wire, the third electrode wire and the fifth electrode wire are connected to the common electrode.

14. The pixel unit of claim 12, wherein the first electrode wire, third electrode wire and the fifth electrode wire are separated from each other by a second spacing, and the first spacing is narrower than the second spacing.

15. The pixel unit of claim 12, wherein the first light-emitting element, the second light-emitting element, and the third light-emitting element emit red light, green light and blue light respectively.

16. The pixel unit of claim 15, wherein the first light-emitting element is a red light-emitting diode chip, the second light-emitting element is a green light-emitting diode chip, and the third light-emitting element is a blue light-emitting diode chip.

17. The pixel unit of claim 15, wherein the first light-emitting element, the second light-emitting element, and the third light-emitting element are a first blue light-emitting diode chip, a second blue light-emitting diode chip and a third blue light-emitting diode chip respectively, a red light wavelength conversion layer is disposed on an upper surface of the first blue light-emitting diode chip, and a green light wavelength conversion layer is disposed on an upper surface of the second blue light-emitting diode chip.

* * * * *